US010014655B2

(12) United States Patent
Nakamura et al.

(10) Patent No.: US 10,014,655 B2
(45) Date of Patent: Jul. 3, 2018

(54) OPTICAL MODULE

(71) Applicant: Sumitomo Electric Industries, Ltd., Osaka-shi (JP)

(72) Inventors: Yuki Nakamura, Itami (JP); Hiromi Nakanishi, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 15/640,004

(22) Filed: Jun. 30, 2017

(65) Prior Publication Data

US 2018/0145479 A1    May 24, 2018

(30) Foreign Application Priority Data

May 2, 2016  (JP) .................... 2016-092446

(51) Int. Cl.
*H01S 5/022* (2006.01)
*H01S 5/40* (2006.01)
*H01S 5/024* (2006.01)

(52) U.S. Cl.
CPC ...... *H01S 5/02236* (2013.01); *H01S 5/02216* (2013.01); *H01S 5/02248* (2013.01); *H01S 5/02296* (2013.01); *H01S 5/02407* (2013.01); *H01S 5/4093* (2013.01)

(58) Field of Classification Search
CPC ............. H01S 5/02236; H01S 5/02216; H01S 5/02407; H01S 5/02296; H01S 5/4093; H01S 5/02248
See application file for complete search history.

(56) References Cited

U.S. PATENT DOCUMENTS

| 3,149,259 A | * | 9/1964 | Sassmannshausen .. | F21L 15/02 |
| | | | | 313/275 |
| 2014/0240952 A1 | * | 8/2014 | Nakanishi .......... | G03B 21/2033 |
| | | | | 362/19 |

FOREIGN PATENT DOCUMENTS

| JP | 2002-299745 A | 10/2002 |
| JP | 2015-215537 A | 12/2015 |

* cited by examiner

*Primary Examiner* — Xinning Niu
(74) *Attorney, Agent, or Firm* — Venable LLP; Michael A. Sartori; Laura G. Remus

(57) ABSTRACT

An optical module includes a light forming part and a protective member that has an emitting window transmitting light from the light forming part and is disposed to surround the light forming part. The light forming part 20 includes a base member, a semiconductor light-emitting element mounted on the base member, a lens mounted on the base member, and the first supporting member that is disposed between the base member and the lens and supports the lens with respect to the base member. The first supporting member has constriction, which has a smaller cross-sectional area than a region in which the first supporting member is in contact with the lens and a region in which the first supporting member is in contact with the base member in a cross section perpendicular to a thickness direction of the first supporting member.

14 Claims, 6 Drawing Sheets

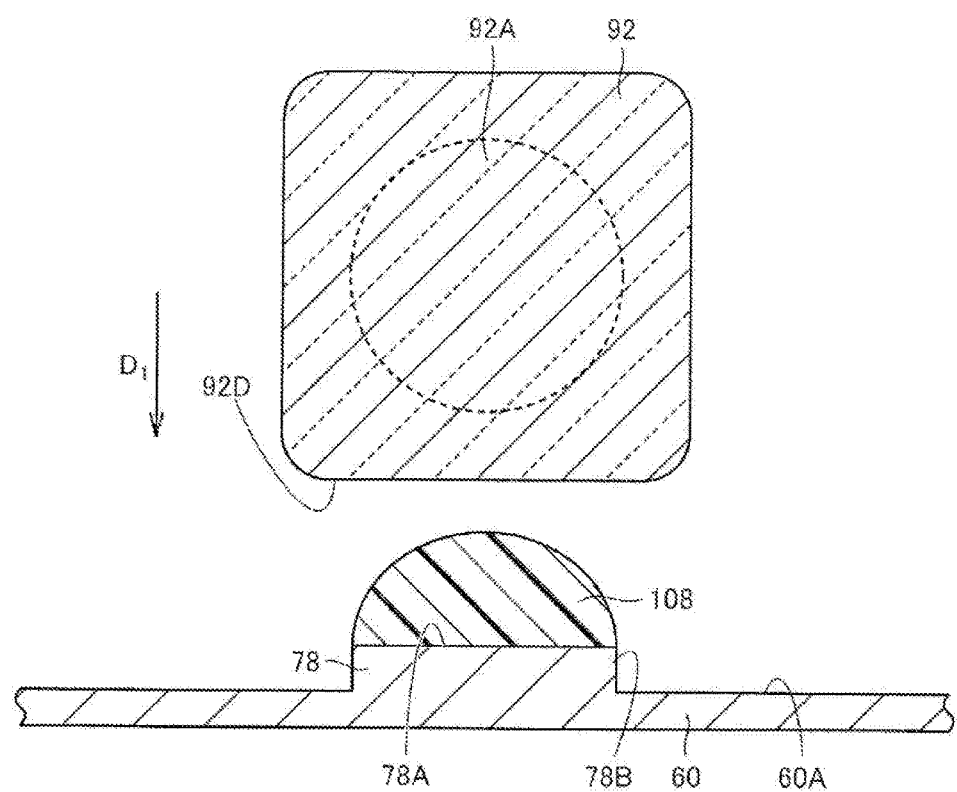

OPTICAL MODULE

TECHNICAL FIELD

The present invention relates to an optical module. This application claims the benefit of Japanese Patent Application No. 2016-092446, filed on May 2, 2016, all of which are incorporated herein by reference in their entirety.

BACKGROUND

An optical module in which semiconductor light-emitting elements and lenses are disposed in a package is known (for example, see Japanese Unexamined Patent Publication No. 2015-215537 or No. 2002-299745). This optical module is used as a light source of various devices such as a display device, an optical pickup device, an optical communication device, and the like.

SUMMARY

An optical module according to the present invention includes: a light forming part configured to form light; and a protective member having an emitting window transmitting light from the light forming part and disposed to surround the light forming part. The light forming part includes: a base member, a semiconductor light-emitting element mounted on the base member; a lens mounted on the base member and configured to convert a spot size of light emitted from the semiconductor light-emitting element; and a first supporting member disposed between the base member and the lens, configured to support the lens with respect to the base member, and comprising an ultraviolet curable resin. The first supporting member has a constriction which has a smaller cross-sectional area than a region in which the first supporting member is in contact with the lens and a region in which the first supporting member is in contact with the base member in a cross section perpendicular to a thickness direction of the first supporting member.

BRIEF DESCRIPTION OF THE DRAWINGS

FIG. 6 is a schematic view illustrating a process of disposing a lens on an ultraviolet curable resin of which a first supporting member is formed.

DETAILED DESCRIPTION

Figure 1:
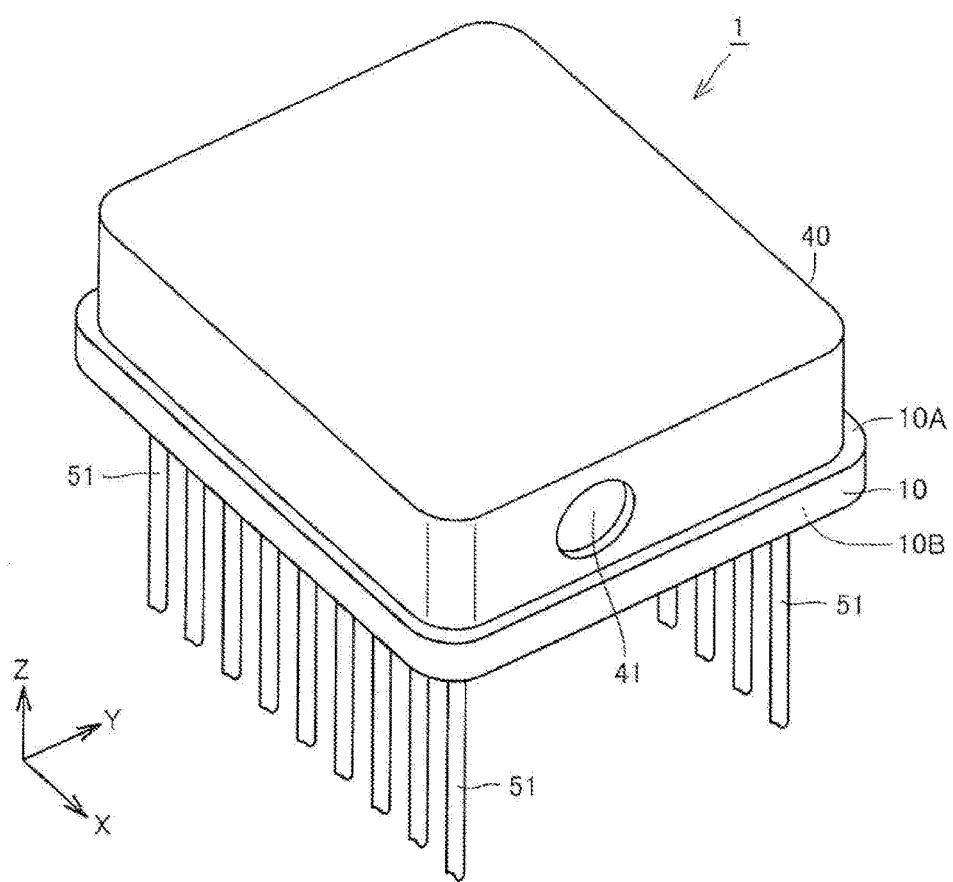
FIG. 1 is a schematic perspective view illustrating a structure of an optical module.

[Description of Embodiments of the Invention as Claimed in the Application Concerned]

First, embodiments of the invention as claimed in the application concerned will be listed and described. An optical module of the application concerned includes: a light forming part configured to form light; and a protective member having an emitting window transmitting light from the light forming part and disposed to surround the light forming part. The light forming part includes: a base member; a semiconductor light-emitting element mounted on the base member, a lens mounted on the base member and configured to convert a spot size of light emitted from the semiconductor light-emitting element; and a first supporting member disposed between the base member and the lens, configured to support the lens with respect to the base member, and comprising an ultraviolet curable resin. The first supporting member has a constriction, which has a smaller cross-sectional area than a region in which the first supporting member is in contact with the lens and a region in which the first supporting member is in contact with the base member in a cross section perpendicular to a thickness direction of the first supporting member.

The spot size of light emitted from the semiconductor light-emitting element in the optical module is converted at the lens corresponding to the semiconductor light-emitting element. To make performance of the optical module high, it is important to accurately adjust an optical axis of the lens. Therefore, an optical module in which the optical axis of the lens can be precisely adjusted is required.

The lens is generally adhered onto the base member by, for instance, an adhesive such as an ultraviolet curable resin. When the ultraviolet curable resin is used as the adhesive, the lens can be fixed, for instance, in the following procedure. First, an amount of the ultraviolet curable resin which is required for adhesion is applied on the base member. Next, the lens is placed on the base member on which the ultraviolet curable resin is applied while the optical axis thereof is adjusted, and is fixed by applying ultraviolet. However, it is difficult to sufficiently adjust the optical axis in this method.

As described above, the optical module of the application concerned includes the lens that converts the spot size of light emitted from the semiconductor light-emitting element, and the first supporting member, which is disposed between the base member and the lens, supports the lens with respect to the base member, and comprises an ultraviolet curable resin. The first supporting member has the constriction, which has the smaller cross-sectional area than the region in which the first supporting member is in contact with the lens and the region in which the first supporting member is in contact with the base member in the cross section perpendicular to the thickness direction of the first supporting member. The ultraviolet curable resin is not simply used as the adhesive, but is used as a material of which the first supporting member, which has a thickness that is thick enough to have the constriction, is formed. Thereby, a height and direction of the lens can be sufficiently adjusted in the adjustment of the optical axis of the lens. Specifically, the first supporting member comprising an ultraviolet curable resin has a sufficient thickness, and thereby a width (a degree of freedom) of the adjustment of the height and direction of the lens is increased. After the height and direction of the lens are sufficiently adjusted, the lens is fixed by irradiating the ultraviolet curable resin with ultraviolet light. Thus, the sufficient adjustment of the optical axis can be achieved. As described above, according to the optical module of the application concerned, the optical axis of the lens can be precisely adjusted.

In the optical module, the base member may have a first holding part holding the first supporting member. The base member has the first holding part, and thereby the first supporting member is easily held at given position. As a result, the lens is easily disposed on the first supporting member.

In the optical module, the first holding part may be a protrusion protruding from the base member. The first holding part is the protrusion, and thereby holdability of pre-cured ultraviolet curable resin placed on the first holding part is enhanced. As a result, the first supporting member, which has a thickness that is thick enough to have the constriction, is easily formed.

In the optical module, a thickness of the first supporting member may be 30 μm or more and 70 μm or less. When the thickness of the first supporting member is 30 μm or more, the height and direction of the lens can be more sufficiently adjusted in the adjustment of the optical axis of the lens supported by the first supporting member. The first supporting member comprising a resin having a great linear expansion coefficient is expanded by heat generated during use of the optical module. When the thickness of the first supporting member exceeds 70 μm, there is a possibility of shift of the optical axis of the lens supported by the first supporting member being increased. The thickness of the first supporting member is 30 μm or more and 70 μm or less, and thereby sufficient adjustment of the height and direction of the lens in the adjustment of the optical axis of the lens and suppression of the shift of the optical axis of the lens can be compatible.

In the optical module, the light forming part may include: a plurality of semiconductor light-emitting elements that are mounted on the base member, a plurality of lenses that are mounted on the base member and are disposed to correspond to the plurality of semiconductor light-emitting elements; and at least one filter that is mounted on the base member and multiplex light from the plurality of semiconductor light-emitting elements.

In this embodiment, the plurality of semiconductor light-emitting elements can be disposed inside a single package, and light from these semiconductor light-emitting elements can be multiplexed inside the package. Thereby, in comparison with a case in which light from a plurality of packages are multiplexed, a device in which the optical module is used can be made compact. As the filters, for example, wavelength selective filters, polarization synthesis filters, etc. can be adopted.

The optical module may further include at least one second supporting member that is disposed between the base member and at least one filter, is configured to support at least one filter with respect to the base member, and comprises an ultraviolet curable resin. At least one second supporting member may have a constriction, which has a smaller cross-sectional area than a region in which at least one second supporting member is in contact with at least one filter and a region in which at least one second supporting member is in contact with the base member in a cross section perpendicular to a thickness direction of at least one second supporting member.

Like the lens, the filter is also generally adhered onto the base member by an adhesive such as an ultraviolet curable resin. However, it is difficult to sufficiently adjust optical axis of the filter (optical axis of light reflected by the filter) in such a method. In contrast, the ultraviolet curable resin is not simply used as the adhesive, but is used as a material of which the second supporting member, which has a thickness that is thick enough to have the constriction, is formed. Thereby, a height and direction of the filter can be sufficiently adjusted in adjustment of the optical axis of the filter.

In the optical module, the base member may have at least one second holding part holding at least one second supporting member. The base member has the second holding part, and thereby the second supporting member is easily held at given position. As a result, the filter is easily disposed on the second supporting member.

In the optical module, at least one second holding part may be a protrusion protruding from the base member. The second holding part is the protrusion, and thereby holdability of a pre-cured ultraviolet curable resin placed on the second holding part is enhanced. As a result, the second supporting member, which has a thickness that is thick enough to have the constriction, is easily formed.

In the optical module, a thickness of at least one second supporting member may be 30 μm or more and 70 μm or less. When the thickness of the second supporting member is 30 μm or more, the height and direction of the filter can be more sufficiently adjusted in the adjustment of the optical axis of the filter supported by the second supporting member. The second supporting member comprising a resin having a great linear expansion coefficient is expanded by heat generated during use of the optical module. When the thickness of the second supporting member exceeds 70 μm, there is a possibility of shift of the optical axis of the filter supported by the second supporting member being increased. The thickness of the second supporting member is 30 μm or more and 70 μm or less, and thereby sufficient adjustment of the height and direction of the filter in the adjustment of the optical axis of the filter and suppression of the shift of the optical axis of the filter can be compatible.

In the optical module, the plurality of semiconductor light-emitting elements may include a semiconductor light-emitting element that emits red light, a semiconductor light-emitting element that emits green light, and a semiconductor light-emitting element that emits blue light. Thus, light from these semiconductor light-emitting elements can be multiplexed, and light of a desired color can be formed.

In the optical module, the semiconductor light-emitting element may be a laser diode. With this configuration, emitted light with a small variation in wavelength can be obtained.

The optical module may further include a plurality of first supporting members, each of which is disposed between the base member and the corresponding lens, configured to support the corresponding lens with respect to the base member, and comprises an ultraviolet curable resin.

In the optical module, the base member may have a plurality of first holding parts, each of which holds the corresponding first supporting member.

[Details of the Embodiments of the Invention as Claimed in the Application Concerned]

Figure 2:
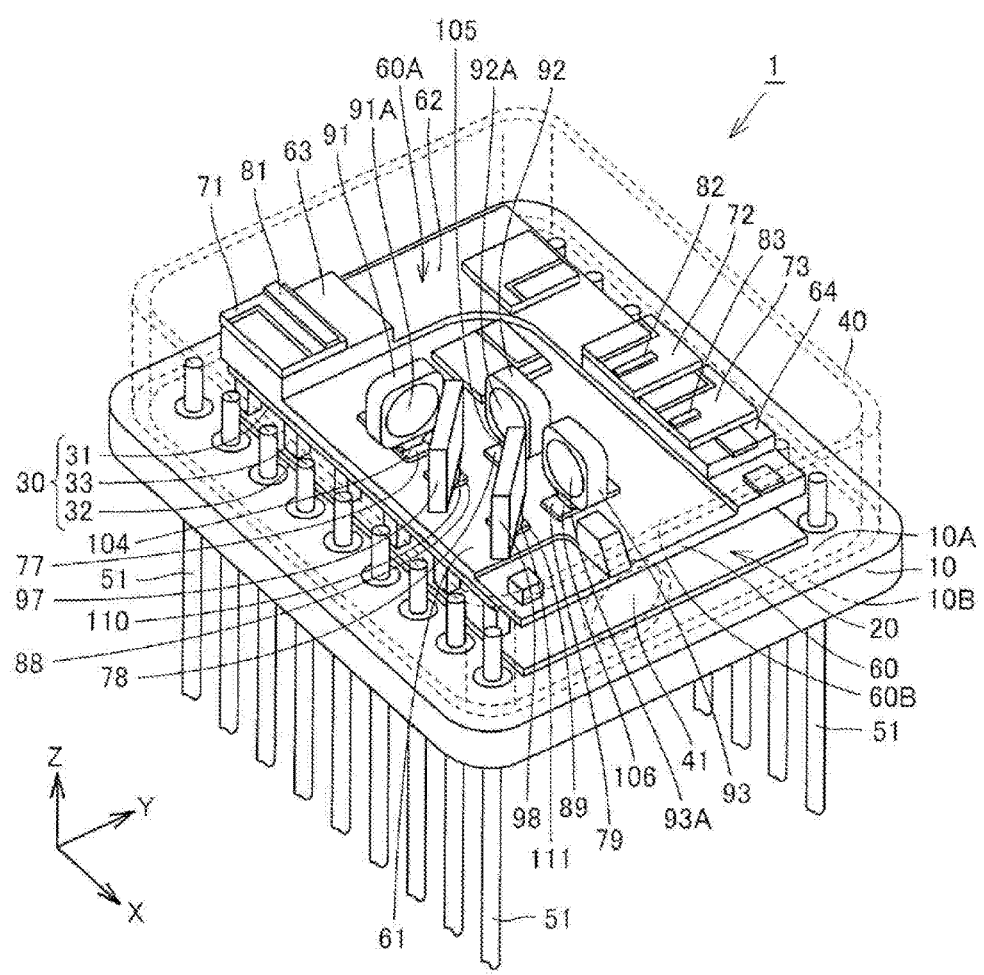
FIG. 2 is a schematic perspective view illustrating the structure of the optical module.
Figure 3:
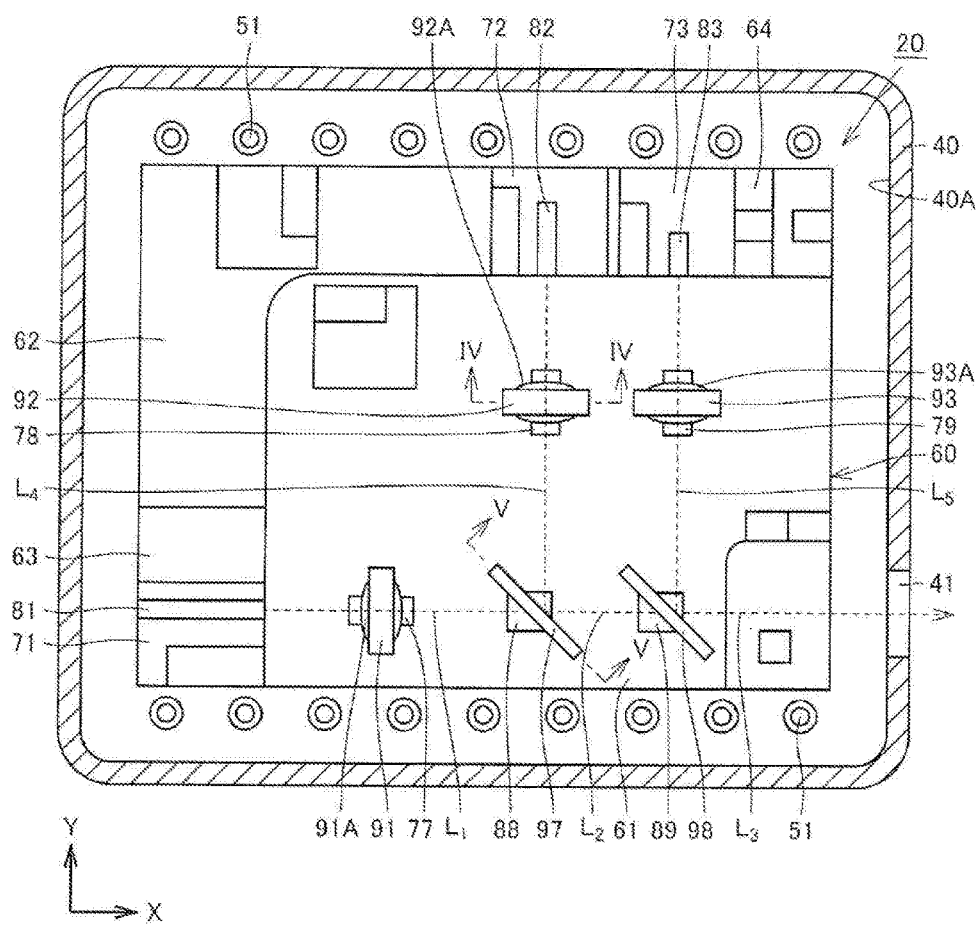
FIG. 3 is a schematic top view illustrating the structure of the optical module.

Next, an embodiment of the optical module according to the present invention will be described with reference to FIGS. 1 to 6. FIG. 1 is a schematic perspective view illustrating a structure of an optical module 1 in the present embodiment. FIG. 2 is a view corresponding to a state in which a cap 40 of FIG. 1 is demounted. FIG. 3 is a schematic view corresponding to FIG. 2. In the following figures, the same or equivalent portions are given the same reference signs, and description thereof will not be repeated.

Referring to FIGS. 1 and 2, the optical module 1 in the present embodiment includes a stem 10 having a flat plate shape, a light forming part 20 that is disposed on one principal surface 10A of the stem 10 and forms light, a cap 40 that is disposed in contact with the one principal surface 10A of the stem 10 to cover the light forming part 20, and a plurality of lead pins 51 that penetrate from the other principal surface 10B side to the one principal surface 10A side of the stem 10 and protrude to both the one principal surface 10A side and the other principal surface 10B side. The stem 10 and the cap 40 are kept airtight by performing, for instance, welding. In an embodiment, the light forming part 20 is hermetically sealed by the stem 10 and the cap 40. A gas, such as dry air, from which moisture is reduced (removed) is encapsulated in a space surrounded by the stem 10 and the cap 40.

An emitting window 41 for transmitting light from the light forming part 20 is formed in the cap 40. The emitting window 41 may have a flat plate shape whose principal surfaces are parallel to each other, or the shape of a lens that condenses or diffuses light from the light forming part 20. The stem 10 and the cap 40 constitute a protective member.

Referring to FIGS. 2 and 3, the light forming part 20 includes a base plate 60 that is a base member having a plate shape. The base plate 60 has one principal surface 60A having an oblong shape in a plan view. The base plate 60 includes a base region 61 and a chip mounting region 62. The chip mounting region 62 is formed in a region that includes one short edge of the one principal surface 60A and one long edge connected to the short edge. A thickness of the chip mounting region 62 is greater than that of the base region 61. As a result, a height of the chip mounting region 62 is greater than that of the base region 61. In the chip mounting region 62, a first chip mounting region 63 is formed in a region on a side of the one short edge which is opposite to a side at which the one short edge is connected to the one long edge, and is a region having a greater thickness (a higher height) than a region adjacent to the region. In the chip mounting region 62, a second chip mounting region 64 is formed in a region on a side of the one long edge which is opposite to the side at which the one long edge is connected to the one short edge, and is a region having a greater thickness (a higher height) than a region adjacent to the region.

A first sub-mount 71 having a flat plate shape is disposed on the first chip mounting region 63. As a first semiconductor light-emitting, a red laser diode 81 is disposed on the first sub-mount 71. On the other hand, second and third sub-mounts 72 and 73, each of which has a flat plate shape, are disposed on the second chip mounting region 64. The third sub-mount 73 is disposed at a side opposite to a connection portion at which the one long edge and the one short edge are connected to each other when viewed from the second sub-mount 72. As a second semiconductor light-emitting element, a green laser diode 82 is disposed on the second sub-mount 72. As a third semiconductor light-emitting element, blue laser diode 83 is disposed on the third sub-mount 73. Heights of optical axes of the red laser diode 81, the green laser diode 82 and the blue laser diode 83 (when the one principal surface 60A of the base plate 60 is set as a reference plane, distances between the reference plane and the optical axes, or distances from the reference plane in a Z-axial direction) are adjusted by the first sub-mount 71, the second sub-mount 72, and the third sub-mount 73 to match one another.

The optical module 1 includes an electronic cooling module 30 between the stem 10 and the light forming part 20. The electronic cooling module 30 includes an endothermic plate 31, an exothermic plate 32, and semiconductor posts 33 that are disposed side by side between the endothermic plate 31 and the exothermic plate 32 with electrodes interposed. The endothermic plate 31 and the exothermic plate 32 are formed of, for instance, alumina. The endothermic plate 31 is disposed in contact with the other principal surface 60B of the base plate 60. The exothermic plate 32 is disposed in contact with the one principal surface 10A of the stem 10. In the present embodiment, the electronic cooling module 30 is a Peltier module (a Peltier element). As a current flows to the electronic cooling module 30, heat of the base plate 60 in contact with the endothermic plate 31 moves to the stem 10, and the base plate 60 is cooled. As a result, a rise in temperatures of the red laser diode 81, the green laser diode 82, and the blue laser diode 83 is suppressed. Thereby, the optical module 1 can be used in an environment in which a temperature is raised, for instance when mounted in a vehicle. The temperatures of the red laser diode 81, the green laser diode 82, and the blue laser diode 83 are maintained within a proper range, and thereby light of a desired color can be accurately formed.

A first lens holding part 77, a second lens holding part 78, and a third lens holding part 79 are formed on the base region 61 of the base plate 60. The first lens holding part 77, the second lens holding part 78, and the third lens holding part 79 are first holding parts. Each of the first lens holding part 77, the second lens holding part 78, and the third lens holding part 79 is a protrusion protruding from the principal surface 60A of the base plate 60. The protrusion is a post body having lateral surfaces intersecting the principal surface 60A of the base plate 60 and a top surface connected to the lateral surfaces.

First, second and third lens supporting members 104, 105 and 106 are disposed between the first, second and third lens holding parts 77, 78 and 79 on the base plate 60 and corresponding first, second and third lenses 91, 92 and 93. The first lens supporting member 104, the second lens supporting member 105, and the third lens supporting member 106 are first supporting members. Each of the first lens supporting member 104, the second lens supporting member 105, and the third lens supporting member 106 is formed of an ultraviolet curable resin such as an epoxy ultraviolet curable resin, an acrylic ultraviolet curable resin, or the like.

The first lens 91, the second lens 92, and the third lens 93 are disposed on the first lens supporting member 104, the second lens supporting member 105, and the third lens supporting member 106, respectively. The first lens 91, the second lens 92, and the third lens 93 have lens parts 91A, 92A and 93A, respectively, whose surfaces form lens surfaces. The lens parts 91A, 92A and 93A of the first lens 91, the second lens 92, and the third lens 93 are molded integrally with regions other than the lens parts 91A, 92A and 93A. Central axes of the lens parts 91A, 92A and 93A of the first lens 91, the second lens 92, and the third lens 93, namely optical axes of the lens parts 91A, 92A and 93A, are adjusted to be coaxial with the optical axes of the red laser diode 81, the green laser diode 82, and the blue laser diode 83. The first lens 91, the second lens 92, and the third lens 93 convert spot sizes of light emitted from the red laser diode 81, the green laser diode 82, and the blue laser diode 83. The spot sizes of light emitted from the red laser diode 81, the green laser diode 82, and the blue laser diode 83 are converted to be coaxial with one another by the first lens 91, the second lens 92, and the third lens 93.

A first filter holding part 88 and a second filter holding part 89 are formed on the base region 61 of the base plate 60. The first filter holding part 88 and the second filter holding part 89 are second holding parts. Each of the first filter holding part 88 and the second filter holding part 89 is a protrusion protruding from the principal surface 60A of the base plate 60. The protrusion is a post body having lateral surfaces intersecting the principal surface 60A of the base plate 60 and a top surface connected to the lateral surfaces.

First and second filter supporting members 110 and 111 are disposed between the first and second filter holding parts 88 and 89 on the base plate 60 and corresponding first and second filters 97 and 98, respectively. The first and second filter supporting members 110 and 111 are second supporting members. Each of the first filter supporting member 110 and the second filter supporting member 111 is formed of an ultraviolet curable resin such as an epoxy ultraviolet curable resin, an acrylic ultraviolet curable resin, or the like.

The first filter 97 and the second filter 98 are disposed on the first filter supporting member 110 and the second filter supporting member 111, respectively. Each of the first filter 97 and the second filter 98 has a flat plate shape having principal surfaces parallel to each other. The first filter 97 and the second filter 98 are, for instance, wavelength selective filters. The first filter 97 and the second filter 98 are dielectric multilayer film filters. Specifically, the first filter 97 transmits red light, and reflects green light. The second filter 98 transmits red light and green light, and reflects blue light. In this way, the first filter 97 and the second filter 98 selectively transmit and reflect specific wavelengths of light. As a result, the first filter 97 and the second filter 98 multiplex light emitted from the red laser diode 81, the green laser diode 82, and the blue laser diode 83.

Referring to FIG. 3, the red laser diode 81, the lens parts 91A of the first lens 91, the first filter 97, and the second filter 98 are disposed on a straight line in an emitting direction of light of the red laser diode 81 side by side (side by side in an X-axial direction). The green laser diode 82, the lens parts 92A of the second lens 92, and the first filter 97 are disposed on a straight line in an emitting direction of light of the green laser diode 82 side by side (side by side in a Y-axial direction). The blue laser diode 83, the lens parts 93A of the third lens 93, and the second filter 98 are disposed on a straight line in an emitting direction of light of the blue laser diode 83 side by side (side by side in the Y-axial direction). That is, the emitting direction of the red laser diode 81 intersects the emitting directions of the green and blue laser diodes 82 and 83. To be more specific, the emitting direction of the red laser diode 81 is perpendicular to the emitting directions of the green and blue laser diodes 82 and 83. The emitting direction of the green laser diode 82 is a direction along the emitting direction of the blue laser diode 83. To be more specific, the emitting direction of the green laser diode 82 and the emitting direction of the blue laser diode 83 are parallel to each other. The principal surfaces of the first and second filters 97 and 98 are inclined with respect to the emitting direction of light of the red laser diode 81. To be more specific, the principal surfaces of the first and second filters 97 and 98 are inclined at an angle of 45° with respect to the emitting direction (the X-axial direction) of light of the red laser diode 81.

Next, an operation of the optical module 1 in the present embodiment will be described. Referring to FIG. 3, the red light emitted from the red laser diode 81 travels along an optical path $L_1$ and is incident on the lens part 91A of the first lens 91, so that the spot size of light is converted. Specifically, for example, the red light emitted from the red laser diode 81 is converted into collimated light. The red light whose spot size is converted in the first lens 91 travels along the optical path $L_1$ and is incident on the first filter 97. Since the first filter 97 transmits the red light, light emitted from the red laser diode 81 travels along an optical path $L_2$ and is incident on the second filter 98. Since the second filter 98 transmits the red light, light emitted from the red laser diode 81 further travels along an optical path $L_3$, and is emitted to the outside of the optical module 1 through the emitting window 41 of the cap 40.

The green light emitted from the green laser diode 82 travels along an optical path $L_4$ and is incident on the lens part 92A of the second lens 92, so that the spot size of light is converted. Specifically, for example, the green light emitted from the green laser diode 82 is converted to collimated light. The green light whose spot size is converted in the second lens 92 travels along the optical path $L_4$ and is incident on the first filter 97. Since the first filter 97 reflects the green light, light emitted from the green laser diode 82 joins the optical path $L_2$. As a result, the green light is multiplexed with the red light, travels along the optical path $L_2$, and is incident on the second filter 98. Since the second filter 98 transmits the green light, light emitted from the green laser diode 82 further travels along the optical path $L_3$, and is emitted to the outside of the optical module 1 through the emitting window 41 of the cap 40.

The blue light emitted from the blue laser diode 83 travels along an optical path $L_5$ and is incident on the lens part 93A of the third lens 93, so that the spot size of light is converted. Specifically, for example, the blue light emitted from the blue laser diode 83 is converted into collimated light. The blue light whose spot size is converted in the third lens 93 travels along the optical path $L_5$ and is incident on the second filter 98. Since the second filter 98 reflects the blue light, light emitted from the blue laser diode 83 joins the optical path $L_3$. As a result, the blue light is multiplexed with the red light and the green light, travels along the optical path $L_3$, and is emitted to the outside of the optical module 1 through the emitting window 41 of the cap 40.

[Structures of the First Holding Parts and the First Supporting Members]

Figure 4:
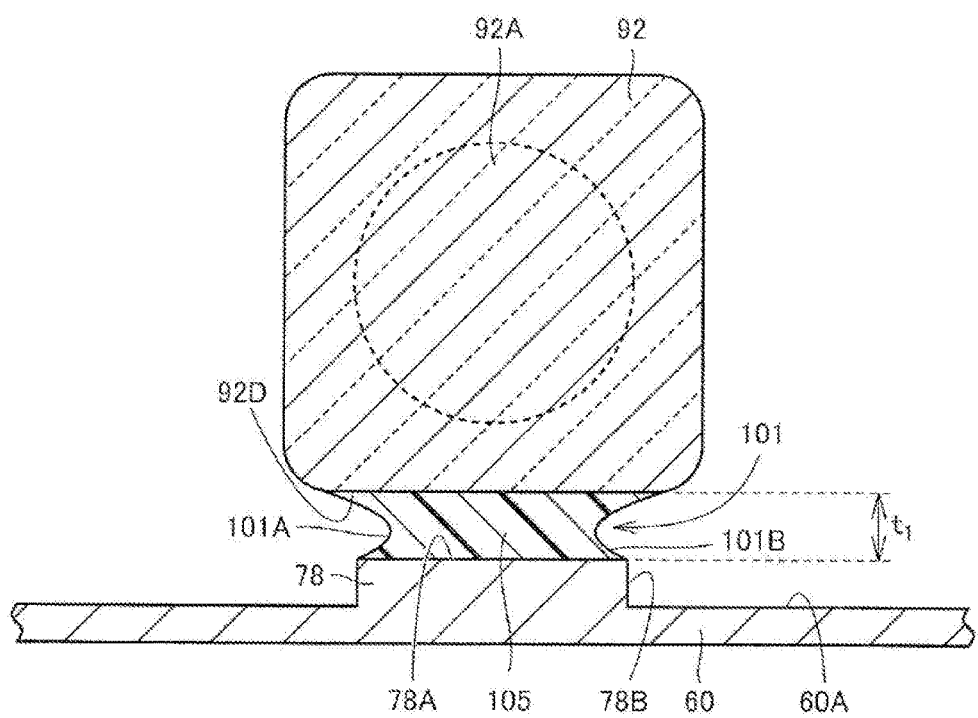
FIG. 4 is a schematic sectional view corresponding to a state in which a cross section taken along segment IV-IV of FIG. 3 is viewed in directions of arrows.

Next, referring to FIG. 4, structures of the first lens holding part 77, the second lens holding part 78, and the third lens holding part 79 that are the first holding parts, and structures of the first lens supporting member 104, the second lens supporting member 105, and the third lens supporting member 106 that are the first supporting members will be described. FIG. 4 is a schematic sectional view corresponding to a state in which a cross section taken along segment IV-IV of FIG. 3 is viewed in directions of arrows.

Hereinafter, only the second lens holding part 78 will be described as representative of the first holding parts, and the descriptions of the first and third lens holding parts 77 and 79 will be omitted. Details of the description of the second lens holding part 78 also apply to the first lens holding part 77 and the third lens holding part 79. Only the second lens supporting member 105 will be described as representative of the first supporting members, and the description of the first and third lens supporting members 104 and 106 will be omitted. Details of the description of the second lens supporting member 105 also apply to the first lens supporting member 104 and the third lens supporting member 106.

Referring to FIG. 4, the base plate 60 has the second lens holding part 78 as the first holding part. The second lens holding part 78 is the protrusion protruding from the principal surface 60A of the base plate 60. The second lens holding part 78 includes lateral surfaces 78B intersecting the principal surface 60A of the base plate 60, and a top surface 78A intersecting the lateral surfaces 78B. The lateral surfaces 78B of the second lens holding part 78 and the principal surface 60A of the base plate 60 are, for instance, orthogonal to each other. A shape of the second lens holding part 78 is a right post body such as a rectangular parallelepiped, a right circular cylinder, or the like. An angle formed by the lateral surface 78B and the top surface 78A may be less than or equal to 90°.

The second lens supporting member 105 comprises an ultraviolet curable resin. The second lens supporting member 105 is a structure having a thickness $t_1$. The second lens supporting member 105 has a small width in a width direction of the second lens 92 (in a direction along the top surface 78A of the second lens holding part 78) in a cross section perpendicular to the optical axis of the second lens 92. The second lens supporting member 105 has first constriction 101. The first constriction 101 is constriction having a smaller cross-sectional area than a region in which the second lens supporting member 105 is in contact with the second lens 92 and a region in which the second lens supporting member 105 is in contact with the second lens holding part 78 of the base plate 60 in a cross section perpendicular to a thickness direction of the second lens supporting member 105 that is the first supporting member. Referring to FIG. 4, a cross-sectional area of the second lens supporting member 105 in the cross section perpendicular to the thickness direction is the largest where the second lens supporting member 105 is in contact with the second lens 92, and second largest where the second lens supporting member 105 is in contact with the top surface 78A of the second lens holding part 78 on the base plate 60. The cross-sectional area of the first constriction 101 of the second lens supporting member 105 is smaller than the cross-sectional area of the region in which the second lens supporting member 105 is in contact with the second lens 92 and the cross-sectional area of the region in which the second lens supporting member 105 is in contact with the top surface 78A of the second lens holding part 78 on the base plate 60.

The first constriction 101 is formed of a curved surface. Referring to FIG. 4, in the cross section perpendicular to the optical axis of the second lens 92, the first constriction 101 includes a first curving part 101A and a second curving part 101B on the opposite sides of the second lens 92 in the width direction. In the cross section perpendicular to the optical axis of the second lens 92, the first curving part 101A and the second curving part 101B form recess portions recessed toward the middle of the second lens 92 in the width direction. Referring to FIG. 4, in the cross section perpendicular to the optical axis of the second lens 92, each of the first curving part 101A and the second curving part 101B has a curvilinear part whose curvature continuously changes.

The thickness $t_1$ of the second lens supporting member 105 as the first supporting member is preferably 30 μm or more and 70 μm or less. When the thickness $t_1$ of the second lens supporting member 105 is 30 μm or more, a height and direction of the second lens 92 can be more sufficiently adjusted in adjustment of the optical axis of the second lens 92 supported by the second lens supporting member 105. The second lens supporting member 105 comprising a resin having a great linear expansion coefficient is expanded by heat generated during use of the optical module 1. When the thickness $t_1$ of the second lens supporting member 105 exceeds 70 μm, there is a possibility of shift of the optical axis of the second lens 92 supported by the second lens supporting member 105 being increased. Therefore, as the thickness $t_1$ of the second lens supporting member 105 is 30 μm or more and 70 μm or less, sufficient adjustment of the height and direction of the second lens 92 in the adjustment of the optical axis of the second lens 92 and suppression of the shift of the optical axis of the second lens 92 can be compatible. The thickness $t_1$ of the second lens supporting member 105 is more preferably 40 μm or more and 60 μm or less. When the thickness $t_1$ is 40 μm or more, the height and direction of the second lens 92 can be more sufficiently adjusted. When the thickness $t_1$ is 60 μm or less, the shift of the optical axis of the second lens 92 can be more sufficiently suppressed.

In this way, the second lens supporting member 105 having the thickness $t_1$ that is thick enough to have the first constriction 101 comprises an ultraviolet curable resin, and thereby a width (a degree of freedom) of the adjustment of the height and direction of the second lens 92 in the adjustment of the optical axis of the second lens 92 is increased. As a result, sufficient adjustment of the optical axis can be achieved.

[Structures of the Second Holding Parts and the Second Supporting Members]

Figure 5:
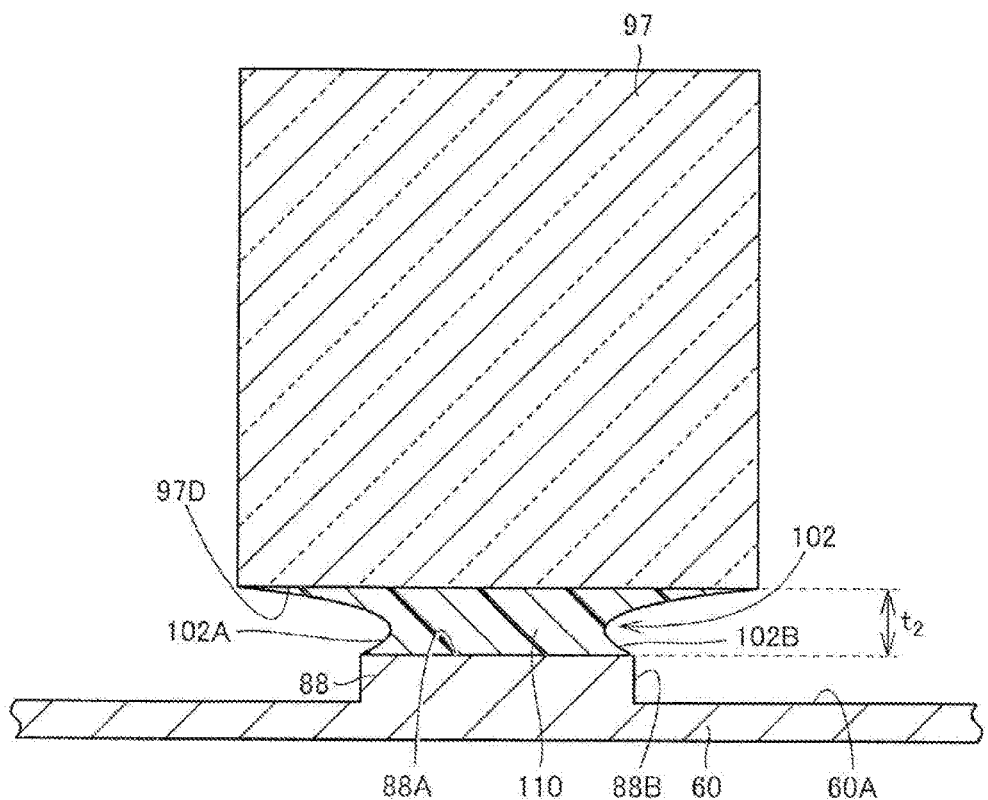
FIG. 5 is a schematic sectional view corresponding to a state in which a cross section taken along segment V-V of FIG. 3 is viewed in directions of arrows.

Next, referring to FIG. 5, structures of the first filter holding part 88 and the second filter holding part 89 that are the second holding parts, and structures of the first filter supporting member 110 and the second filter supporting member 111 that are the second supporting members will be described. FIG. 5 is a schematic sectional view corresponding to a state in which a cross section taken along segment V-V of FIG. 3 is viewed in directions of arrows.

Hereinafter, only the first filter holding part 88 will be described as representative of the second holding parts, and the description of the second filter holding part 89 will be omitted. Details of the description of the first filter holding part 88 also apply to the second filter holding part 89. Only the first filter supporting member 110 will be described as representative of the second supporting members, and the description of the second filter supporting member 111 will be omitted. Details of the description of the first filter supporting member 110 also apply to the second filter supporting member 111.

Referring to FIG. 5, the base plate 60 has the first filter holding part 88 as the second holding part. The first filter holding part 88 is the protrusion protruding from the principal surface 60A of the base plate 60. The first filter holding part 88 includes lateral surfaces 88B intersecting the principal surface 60A of the base plate 60, and a top surface 88A intersecting the lateral surfaces 88B. The lateral surfaces 88B of the first filter holding part 88 and the principal surface 60A of the base plate 60 are, for instance, orthogonal to each other. A shape of the first filter holding part 88 is a right post body such as a rectangular parallelepiped, a right circular cylinder, or the like. An angle formed by the lateral surface 88B and the top surface 88A may be less than or equal to 90°, and is preferably 90°.

The first filter supporting member 110 comprises an ultraviolet curable resin. The first filter supporting member 110 is a structure having a thickness $t_2$. The first filter supporting member 110 has a small width in a width direction of the first filter 97 (in a direction along the top surface 88A of the first filter holding part 88) in a cross section perpendicular to the optical axis of the first filter 97. The first filter supporting member 110 has second constriction 102. The second constriction 102 is constriction having a smaller cross-sectional area than a region in which the first filter supporting member 110 is in contact with the first filter 97 and a region in which the first filter supporting member 110 is in contact with the first filter holding part 88 of the base plate 60 in a cross section perpendicular to a thickness direction of the first filter supporting member 110 that is the second supporting member. Referring to FIG. 5, a cross-sectional area of the first filter supporting member 110 in the cross section perpendicular to the thickness direction is largest where the first filter supporting member 110 is in contact with the first filter 97, and second largest where the first filter supporting member 110 is in contact with the top surface 88A of the first filter holding part 88 on the base plate 60. The cross-sectional area of the second constriction 102 of the first filter supporting member 110 is smaller than the cross-sectional area of the region in which the first filter supporting member 110 is in contact with the first filter 97 and the cross-sectional area of the region in which the first filter supporting member 110 is in contact with the top surface 88A of the first filter holding part 88 on the base plate 60.

The second constriction 102 is formed of a curved surface. Referring to FIG. 5, in the cross section perpendicular to the optical axis of the first filter 97, the second constriction 102 includes a third curving part 102A and a fourth curving part 102B on the opposite sides of the first filter 97 in the width direction. In the cross section perpendicular to the optical axis of the first filter 97, the third curving part 102A and the fourth curving part 102B form recess portions recessed toward the middle of the first filter 97 in the width direction. Referring to FIG. 5, in the cross section perpendicular to the optical axis of the first filter 97, each of the third curving part 102A and the fourth curving part 102B has a curvilinear part whose curvature continuously changes.

The thickness $t_2$ of the first filter supporting member 110 as the second supporting member is preferably 30 μm or more and 70 μm or less. When the thickness $t_2$ of the first filter supporting member 110 is 30 μm or more, a height and direction of the first filter 97 can be more sufficiently adjusted in adjustment of the optical axis of the first filter 97 supported by the first filter supporting member 110. The first filter supporting member 110 formed of a resin having a great linear expansion coefficient is expanded by heat generated during use of the optical module 1. When the thickness $t_2$ of the first filter supporting member 110 exceeds 70 μm, there is a possibility of shift of the optical axis of the first filter 97 supported by the first filter supporting member 110 departing from an allowable range. Therefore, as the thickness of the first filter supporting member 110 is 30 μm or more and 70 μm or less, sufficient adjustment of the height and direction of the first filter 97 in the adjustment of the optical axis of the first filter 97 and suppression of the shift of the optical axis of the first filter 97 can be compatible. The thickness $t_2$ of the first filter supporting member 110 is more preferably 40 μm or more and 60 μm or less. When the thickness $t_2$ is 40 μm or more, the height and direction of the first filter 97 can be more sufficiently adjusted. When the thickness $t_2$ is 60 μm or less, the shift of the optical axis of the first filter 97 can be more sufficiently suppressed.

In this way, the first filter supporting member 110 having the thickness $t_2$ that is thick enough to have the second constriction 102 comprises an ultraviolet curable resin, and thereby a width (a degree of freedom) of the adjustment of the height and direction of the first filter 97 in the adjustment of the optical axis of the first filter 97 is increased. As a result, the sufficient adjustment of the optical axis can be achieved.

[Method of Forming the First Supporting Members]

Next, a method of forming the first lens supporting member 104, the second lens supporting member 105, and the third lens supporting member 106 that are the first supporting members will be described. In the same way as described above, out of the first supporting members, only the method of forming the second lens supporting member 105 will also be described below, and the description of the method of forming the first lens supporting member 104 and the third lens supporting member 106 will be omitted. The first lens supporting member 104 and the third lens supporting member 106 can be formed by the same method as the method of forming the second lens supporting member 105 which will be described below.

Referring to FIG. 6, first, an uncured ultraviolet curable resin 108 is placed on the top surface 78A of the second lens holding part 78. As illustrated in FIG. 6, an amount of the placed uncured ultraviolet curable resin 108 is more than an amount used as a simple adhesive. That is, the amount of the uncured ultraviolet curable resin 108 is enough to form the second lens supporting member 105 as a structure with the constriction. At this time, when the ultraviolet curable resin 108 is applied to the top surface 78A of the second lens holding part 78 that protrudes from the base plate 60 and has a quadrangular post shape, surface tension acts on the ultraviolet curable resin 108. Due to the action of the surface tension, the ultraviolet curable resin 108 is maintained on the second lens holding part 78 without running down from the top surface 78A of the second lens holding part 78.

Next, the second lens 92 is disposed on the uncured ultraviolet curable resin 108. When the second lens 92 is placed on the ultraviolet curable resin 108 in a direction of D1, the ultraviolet curable resin 108 is spread along an outer circumferential surface 92D of the second lens 92. The uncured ultraviolet curable resin 108 has enough viscosity for a sufficient interval to be formed between the second lens 92 and the second lens holding part 78. As a result, the second lens supporting member 105 of the shape having the first constriction 101 as illustrated in FIG. 4 is formed in an uncured state.

In the present embodiment, as the height or direction of the second lens 92 is adjusted with the second lens 92 disposed on the uncured ultraviolet curable resin 108, the optical axis of the second lens 92 can be adjusted. After the optical axis of the second lens 92 is adjusted, the ultraviolet curable resin 108 is irradiated with ultraviolet light and the ultraviolet curable resin 108 is cured, and thereby the second lens 92 is fixed onto the second lens supporting member 105. In this way, the optical axis of the lens is adjusted in a state in which the lens 92 is disposed on the uncured ultraviolet curable resin 108 having a sufficient thickness, and thereby sufficient adjustment of the optical axis can be achieved.

The above method can also be applied when the first filter supporting member 110 and the second filter supporting member 111 are formed. When the first filter supporting member 110 and the second filter supporting member 111 are formed, the first filter 97 or the second filter 98 may be used in the above method instead of the second lens 92.

The above is the description of the present embodiment. The sub-mounts 71, 72 and 73 are configured to comprise a material whose thermal expansion coefficient is close to those of elements or the like mounted on the sub-mounts 71, 72 and 73, and may be configured to comprise, for instance, AlN, SiC, Si, diamond, or the like. Iron, copper, or the like that is, a material having high thermal conductivity, or AlN, CuW, CuMo or the like, may be adopted as a material of which the stem 10 and the cap 40 are formed.

In the above embodiment, the case in which light from the three or four semiconductor light-emitting elements having different emitted wavelengths are multiplexed has been described, but the number of semiconductor light-emitting elements may be one or two, or five or more. In the above embodiment, the case in which the laser diodes 81, 82 and 83 are adopted as the semiconductor light-emitting elements has been described, but, for example, light-emitting diodes may be adopted as the semiconductor light-emitting elements. In the above embodiment, the case in which wavelength selective filters are adopted as the first filter 97 and the second filter 98 has been given by way of example, but these filters may be polarization synthesis filters.

In the above embodiment, the case in which the first filter supporting member 110 has the second constriction 102 has been described, but the first filter supporting member 110 and the second filter supporting member 111 may not have the constriction 102.

The shapes of the first lens holding part 77, the second lens holding part 78, and the third lens holding part 79 that are provided on the base plate 60 are not limited to a shape protruding from the base plate 60. This is also true of the first filter holding part 88 and the second filter holding part 89.

Further, the first lens holding part 77, the second lens holding part 78, and the third lens holding part 79 that are provided on the base plate 60 can be omitted. Similarly, the first filter holding part 88 and the second filter holding part 89 can be omitted.

It should be understood that the embodiment disclosed herein is illustrative in all aspects and is not restrictive in any aspect. The scope of the present invention is defined not by the above description but by the claims, and is intended to include all the modifications and alternations within the meanings and range equivalent to the claims.

The optical module of the application concerned can be particularly advantageously applied to an optical module required to precisely adjust the disposition of the lens guiding light emitted from the semiconductor light-emitting element.

What is claimed is:

1. An optical module comprising:
   a light forming part configured to form light; and
   a protective member having an emitting window transmitting light from the light forming part and disposed to surround the light forming part,
   wherein the light forming part includes:
   a base member;
   a semiconductor light-emitting element mounted on the base member;
   a lens mounted on the base member and configured to convert a spot size of light emitted from the semiconductor light-emitting element; and
   a first supporting member disposed between the base member and the lens, configured to support the lens with respect to the base member, and comprising an ultraviolet curable resin,
   the first supporting member has a constriction comprising a hardened solid core formed from the ultraviolet curable resin, and
   the constriction has a smaller cross-sectional area than a region in which the first supporting member is in contact with the lens and a region in which the first supporting member is in contact with the base member in a cross section perpendicular to a thickness direction of the first supporting member.

2. The optical module according to claim 1, wherein the base member has a first holding part holding the first supporting member.

3. The optical module according to claim 2, wherein the first holding part is a protrusion protruding from the base member.

4. The optical module according to claim 1, wherein a thickness of the first supporting member is 30 μm or more and 70 μm or less.

5. The optical module according to claim 1, wherein the light forming part includes:
   a plurality of semiconductor light-emitting elements that are mounted on the base member;
   a plurality of lenses that are mounted on the base member and are disposed to correspond to the plurality of semiconductor light-emitting elements; and
   at least one filter that is mounted on the base member and multiplex light from the plurality of semiconductor light-emitting elements.

6. The optical module according to claim 5, further comprising at least one second supporting member disposed between the base member and the at least one filter, configured to support the at least one filter with respect to the base member, and comprising an ultraviolet curable resin,
   wherein the at least one second supporting member has a constriction, which has a smaller cross-sectional area than a region in which the at least one second supporting member is in contact with the at least one filter and a region in which the at least one second supporting member is in contact with the base member in a cross section perpendicular to a thickness direction of the at least one second supporting member.

7. The optical module according to claim 6, wherein the base member has at least one second holding part holding the at least one second supporting member.

8. The optical module according to claim 7, wherein the at least one second holding part is a protrusion protruding from the base member.

9. The optical module according to claim 6, wherein a thickness of the at least one second supporting member is 30 μm or more and 70 μm or less.

10. The optical module according to claim 5, wherein the plurality of semiconductor light-emitting elements include a semiconductor light-emitting element that emits red light, a semiconductor light-emitting element that emits green light, and a semiconductor light-emitting element that emits blue light.

11. The optical module according to claim 1, wherein the semiconductor light-emitting element is a laser diode.

12. The optical module according to claim 5, further comprising a plurality of first supporting members, each being disposed between the base member and the corresponding lens, configured to support the corresponding lens with respect to the base member, and comprising an ultraviolet curable resin.

13. The optical module according to claim 11, wherein the base member has a plurality of first holding parts, each holding the corresponding first supporting member.

14. The optical module according to claim 6, wherein the constriction of the at least one second supporting member has a hardened solid core formed from the ultraviolet curable resin.

* * * * *